United States Patent [19]

Lewis, Jr. et al.

[11] 4,119,945
[45] Oct. 10, 1978

[54] ERROR DETECTION AND CORRECTION

[75] Inventors: Henry Garton Lewis, Jr., Princeton; Seraphin Bernard Calo, Rocky Hill, both of N.J.

[73] Assignee: RCA Corporation, New York, N.Y.

[21] Appl. No.: 812,364

[22] Filed: Jul. 1, 1977

[51] Int. Cl.$^2$ ............................................ G06F 11/12
[52] U.S. Cl. ........................................ 340/146.1 AQ
[58] Field of Search ............................. 340/146.1 AQ

[56] References Cited

U.S. PATENT DOCUMENTS

| 3,227,999 | 1/1966 | Hagelbarger | 340/146.1 AQ |
| 3,469,236 | 9/1969 | Gallager | 340/146.1 AQ |
| 3,500,320 | 3/1970 | Massey | 340/146.1 AQ |
| 3,571,795 | 3/1971 | Tong | 340/146.1 AQ |

OTHER PUBLICATIONS

Peterson & Weldon, Error Correcting Codes, The MIT Press, 1972, pp. 404–409.

Primary Examiner—Charles E. Atkinson

Attorney, Agent, or Firm—H. Christoffersen; Samuel Cohen; Carl V. Olson

[57] ABSTRACT

An error detection and correction system in which at least the highest order bit of each data word is given a greater protection against errors in transmission than lower order bits. Useful for digitized TV signals where errors in received high order bits have much worse effect on picture quality than errors in low order bits. A parity is generated for each data word in accordance with a self-orthogonal convolutional code constructed by the use of the base elements of a difference triangle for each bit of the data word, the difference triangles being disjoint, the triangle associated with the highest order bit or bits having a large number or numbers of base elements, and the triangles associated with the lowest order protected bit or bits consisting of a single base element. Errors in received code words are detected and corrected in a decoder including majority logic threshold detectors. Error correcting feedback to the syndrome shift register is limited to errors detected in the high order bits.

1 Claim, 4 Drawing Figures

ERROR DETECTION AND CORRECTION

Television signals, for example, may advantageously be converted from analog form to digital pulse-code-modulation (PCM) form for transmission. If each analog picture element is converted to a six-bit data word, for example, for transmission, each data word represents one of sixty-four quantized levels of the analog signal. If an error occurs in the lowest order bit, the error causes the corresponding reproduced TV picture element to be only one of the sixty-four levels different from intended. However, an error in the highest order bit causes a corresponding reproduced TV picture element to be thirty-two of the sixty-four levels different from intended. It is therefore desirable to transmit each data word with a parity bit generated from the data word in such a manner as to provide a substantially greater probability of detecting and correcting errors in received high order bits of data words than in received low order bits.

The conventional technique for increasing the redundancy of certain bits more than others, is to use different error correcting codes for each of the bits. This implies separate encoders and decoders for each bit, and synchronization schemes which allow different numbers of redundant bits to be inserted and extracted. It is desirable to employ a coding scheme which provides different amounts of redundancy to the different bits in the code word, and which uses a single encoder and decoder.

According to an application Ser. No. 796,339 filed on May 12, 1977, by N. F. Maxemchuk entitled "Error Detection and Correction" and having the same assignee as the present application, at least the highest order bit of each transmitted data word is protected to a greater degree than low order bits by generating, in an encoder, a parity bit for each data word according to a self-orthogonal convolutional code constructed by the use of base elements of a disjoint difference triangle for each of the bits of the data word, the triangle associated with the highest order bit having a largest number of base elements and the triangle associated with the lowest order bit having only one base element. A decoder includes syndrome shift register and error detectors for correcting errors in received data words. Error correcting signals for all bits of a data word which are in error are fed back to correct appropriate bits in the syndrome shift register.

According to an example of the present invention, improved error correction is achieved by feeding back to the syndrome shift register the error correcting signals for solely the high order bit or bits corresponding with the large difference triangle or triangles.

Figure 1:
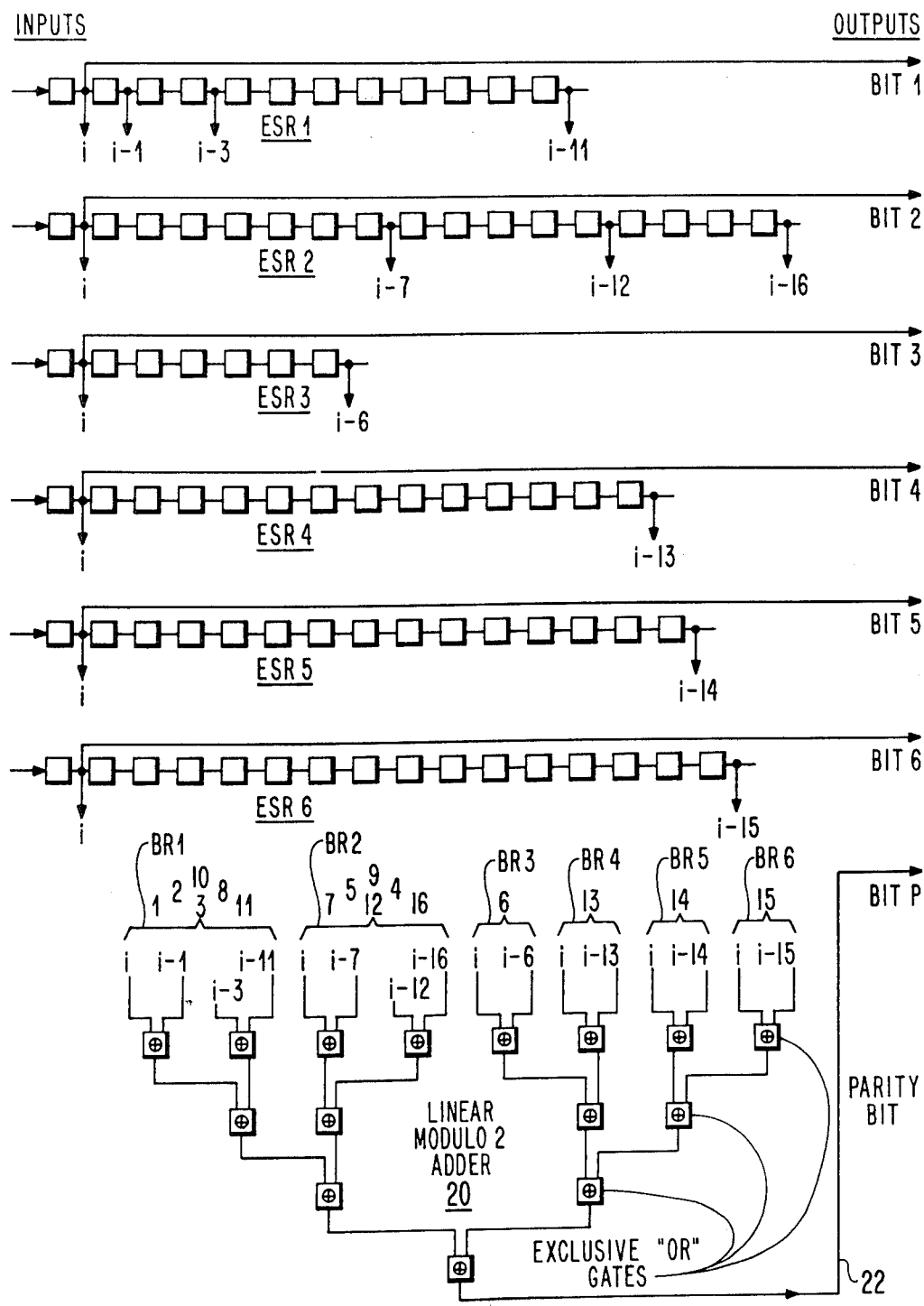
FIG. 1 is a schematic diagram of an encoder constructed according to the prior art.

FIG. 1 shows an encoder which generates one parity bit for every six-bit data word transmitted. Encoder shift registers ESR1 through ESR6 are provided for data bits 1 through 6 which are applied in parallel to the inputs of the shift registers. Each square box of a shift register represents one stage. When six data bits are present at the output of the six input stages of the six shift registers, the seventh and higher numbered stages of the shift registers contain previously received and transmitted bits of the data words. Certain stages of the shift registers are provided with outputs in accordance with the base elements of a specific six-bit convolutional code, constructed by a technique using disjoint difference triangles, shown in FIG. 1 as follows:

|   |   | 10 |   |   |   | 9 |   |   |   |   |   |   |
|---|---|----|---|---|---|---|----|---|---|---|---|---|
|   | 2 |   | 8 |   | 5 |   | 4 |   |   |   |   |   |
| 1 | 3 |   | 11 | 7 | 12 |   | 16 | 6 | 13 | 14 | 15. |
| Bit 1 |   |   |   | Bit 2 |   |   |   | Bit 3 | Bit 4 | Bit 5 | Bit 6 |

The bit 1 triangle has three base elements 1, 3 and 11 corresponding with taps i-1, i-3 and i-11 at the outputs of the first, third and eleventh stages, following the input stage of shift register ESR1. Similarly, the bit 2 triangle has base elements 7, 12 and 16 determining taps on encoder shift register ESR2. Bits 3, 4, 5 and 6 have single-element triangles determining corresponding taps on encoder shift registers ESR3, ESR4, ESR5 and ESR6.

The triangles are called disjoint triangles because they have distinct elements 1 through 15 no one of which is used more than once. Each triangle for bits 1 and 2 is called a difference triangle because the numbers above the base of the triangle are the set of all the positive differences between the base elements of the triangle. The numbers above the base numbers correspond to all positive differences between the indices of the bits employed in the calculation of the syndromes. The code is called a self-orthogonal code because the syndrome equations used to determine a particular data bit contain that bit in all of the syndrome equations, but contain the other received bits in at most one of these equations.

Convolutional codes generated from disjoint difference triangles, for use in error detecting and correcting systems, normally employ triangles for the respective data bits which are of equal size with an equal number, such as three, of base elements to provide substantially equal protection for all the bits of a data word. However, the convolutional code employed in the apparatus described herein by way of example is different in that the disjoint difference triangles for bits 1 and 2 have three base elements (1, 3 and 11; and 7, 12 and 16, respectively) and the disjoint difference triangles for bits 3, 4, 5 and 6 each have one base element (6, 13, 14 and 15, respectively). The high order bits have a higher number of base elements than the low order bits. This results in a higher error protection for the high order bits than for the low order bits. As long as the triangles remain disjoint, the orthogonal property of the syndrome is maintained, and error correction can be performed in the usual manner. When the code described herein is used with a transmission channel having an error rate of $10^{-3}$, the bits of the data word may have error rates computed to be as follows:

Bit 1: $5.5 \times 10^{-6}$

Bit 2: $1.4 \times 10^{-5}$
Bit 3: $1.2 \times 10^{-4}$
Bit 4: $1.9 \times 10^{-4}$
Bit 5: $2.1 \times 10^{-4}$
Bit 6: $2.3 \times 10^{-4}$ The convolutional code employed herein is also characterized in that the syndrome equations, used to correct a particular data bit, include both data bits preceding that bit and data bits following that bit. The data bits preceding the bit to be corrected have already gone through the correction procedure, and, therefore, are less likely to be in error than the bits following the bit to be corrected. Even if two difference triangles have the same number of base elements, and the same number of total bits in the syndrome calculation, one will contain more bits preceding the data bit. The probability of error using this difference triangle will be lower than the probability of error using the other difference triangle. If both difference triangles are assigned to bits in a PCM system, the one containing more corrected bits should be assigned to the higher order PCM bit.

The taps on the shift register ESR1 through ESR6 are connected to correspondingly labeled inputs of a linear modulo 2 adder 20 consisting of an "or" gate tree. More specifically, the taps on shift register ESR1 are connected to the inputs of the adder 20 which are embraced by bracket BR1. Similarly, the taps on shift registers ESR2 through ESR6 are connected to the inputs of the adder 20 which are embraced by brackets BR2 through BR6, respectively. The adder 20 produces at its output 22 a parity bit P for every data word of six bits applied in parallel to the inputs of the six shift registers. Each output six-bit data word together with the one parity bit constitute a code word from the encoder of FIG. 1. The particular six-bit encoder illustrated in FIG. 1, and the particular self-orthogonal convolutional code upon which it is based using disjoint difference triangles, provide the highest degree of error protection for the highest order bit 1, somewhat less protection for bit 2, and progressively less protection for lower order bits 3, 4, 5 and 6. It will be understood that the encoder described is just one example of many that can be constructed for data words including more than, or fewer than, six bits, and providing varying amounts of protection for the bits of the data word.

Figure 2:
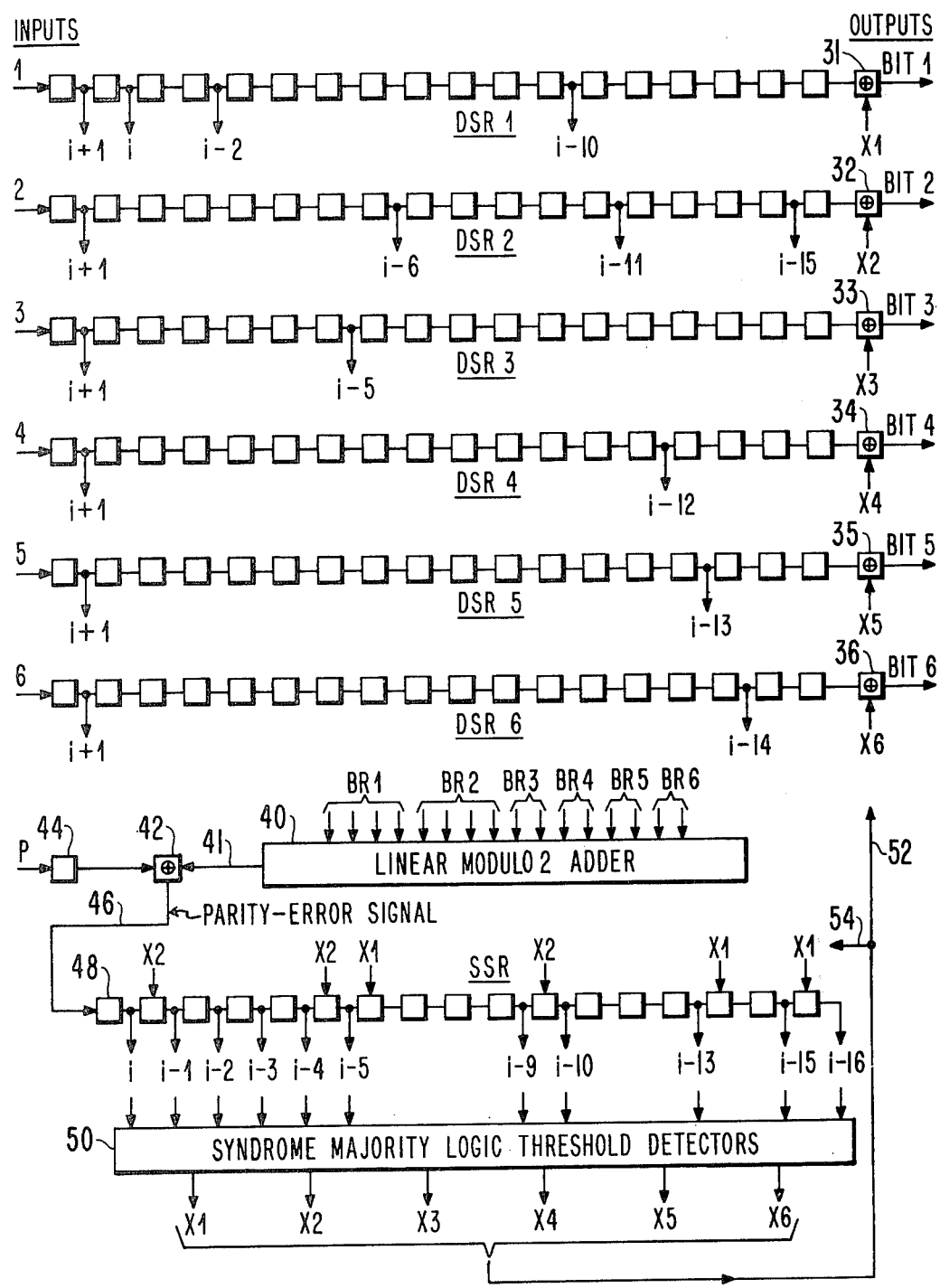
FIG. 2 is a schematic diagram of a decoder according to the teachings of the invention for use on signals encoded by the means shown in FIG. 1.

FIG. 2 is a decoder for code words received over a communications path from a distant encoder according to FIG. 1. The decoder has six decoder shift registers DSR1 through DSR6 for received data bits 1 through 6. The decoder shift registers DSR have taps from input stages and succeeding intermediate stages spaced from input stages by the exact same amounts as the encoding shift registers ESR in FIG. 1. The decoder shift registers DSR additionally have uniformly-distant terminal stages providing outputs to respective output exclusive "or" gates 31 through 36.

The taps from input and intermediate stages of decoder shift registers DSR1 through DSR6 are coupled over paths not shown to inputs of a linear modulo 2 adder 40, which may be constructed exactly the same as the adder 20, in FIG. 1. More specifically, the taps from shift register DSR1 are connected to the inputs of adder 40 embraced by bracket BR1 in FIGS. 2 and 1. Similarly, the taps from shift regiters DSR2 through DSR6 are connected to the inputs of adder 40 embraced by brackets BR2 through BR6, respectively, in FIGS. 2 and 1. The taps on the shift registers DSR1 through DSR6 in FIG. 2 bear designations displaced by one from the designations of the corresponding taps on the shift registers ESR1 through ESR6 in FIG. 1. This is because of a one-bit-time delay of the signals at receiving decoder of FIG. 2 compared with the signals at the transmitting encoder of FIG. 1. The modulo 2 adder 40 generates a parity bit at 41 based on the received bits, for comparison with the received parity bit which was generated in the encoder of FIG. 1. For this purpose, the output 41 of the adder 40 is applied to one input of an exclusive "or" gate 42, which is also receptive to the received parity bits from a stage 44. The gate 42 produces a parity-error signal output which is a "0" when the received and locally-generated parity bits are the same, and is a "1" when they are different.

Figure 3:
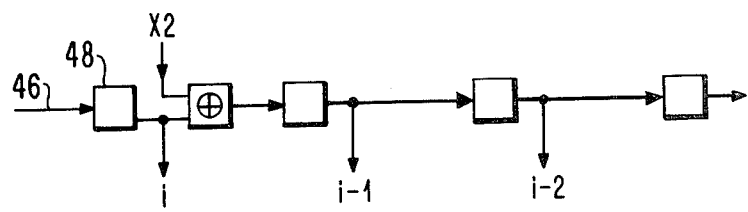
FIG. 3 is a detailed diagram of a portion of the syndrome storage shift register in FIG. 2.

The parity-error signals on line 46 from gate 42 are applied to the input stage 48 of a syndrome storage shift register SSR. Each sequential stage of the register has a labeled output, and some of the stages are also responsive to inputs labeled X1 and X2, which complement the contents of the stages of the register. The complementing may be accomplished by the use of exclusive "or" gates in the couplings between stages of the syndrome shift register after the manner shown in greater detail in FIG. 3 for the first three stages of the syndrome shift register SSR of FIG. 2.

Figure 4:
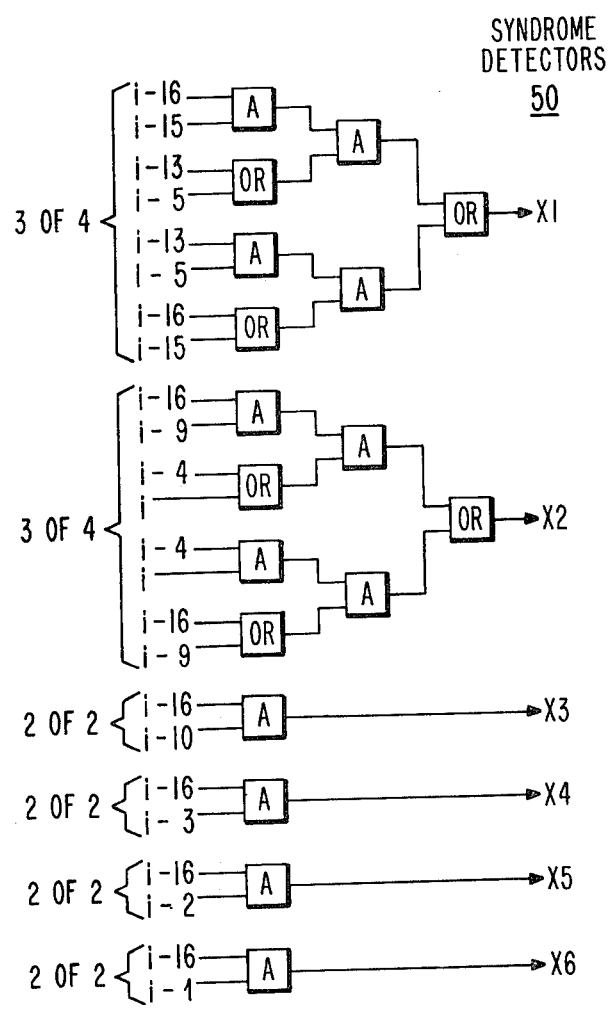
FIG. 4 is a detailed logic diagram of syndrome majority logic threshold detectors useful in a block shown in FIG. 2.

Outputs of indicated ones of the stages of syndrome shift register SSR are coupled to inputs of syndrome majority logic threshold detectors 50, which are shown in detail in FIG. 4 to consist of "and" gates A and "or" gates OR. These syndrome detectors provide outputs X1 through X6 for correcting errors in respective received data bits 1 through 6. The detectors for data bits 1 and 2 provide outputs X1 and X2, respectively, when three out of four of the inputs to the detectors are "1" or true. The detectors for data bits 3 through 6 provide outputs X3 through X6, respectively, when two out of two inputs to the detectors are "1" or true. The outputs X1 through X6 of the syndrome detectors 50 are applied over six-conductor line 52 as error-correcting signals to respective exclusive "or" gates 31 through 36. An error-corrected six-bit data word appears at the outputs of gates 31 through 36.

The error-correcting signals X1 through X6 are also applied over two-conductor lines 54 to complementing inputs of designated ones of the stages of the syndrome storage shift register SSR for the purpose of complementing or correcting the parity-error signals propagated through the syndrome register. This prevents a data bit error, which is being corrected, from adversely affecting the detection and correction of subsequent data bits.

The direct and feedback connections in the loop including the syndrome storage shift register SSR and the syndrome majority logic threshold detectors 50 are made in accordance with syndrome equations which are derived from the parity equation in a manner well known to those skilled in the art. An understanding of how the connections are made can be had by considering the sequence of events, after the system is in operation following the receipt of a data word and associated parity bit by the decoder of FIG. 2.

A received parity bit in stage 44 was calculated using bits of the present data word in the input stages of decoder shift registers DSR1 through DSR6, and some bits of sixteen preceding data words. These preceding data words are present in the stages of the encoder shift registers of FIG. 1 and the stages of the decoder shift registers of FIG. 2. The received parity bit in stage 44 is compared in gate 42 with the locally-generated parity bit from adder 40, and the resulting parity-error signal is applied to the first stage 48 of the syndrome storage shift register SSR.

The received data word and the associated parity-error bit are then propagated to the right, and when they reach the ends of the respective shift registers, the syndrome storage shift register SSR contains parity-error bits associated with all the preceding data words used in calculating the parity of the data bit in the last stages of the shift register DSR1 through DSR6. Consequently, the taps on the syndrome storage shift register SSR used by the snydrome detectors 50 are in a reversed order compared with the taps on the data word shift registers DSR1 through DSR6. Corresponding encoder taps, decoder taps and syndrome taps for designated ones of the data bits 1 through 6 are shown in Table I.

TABLE I

| ENCODER TAPS | DECODER TAPS | SYNDROME TAPS | FOR DATA BITS |
|---|---|---|---|
| i | i+1 | i-16 | 1,2,3,4,5,6 |
| i-1 | i | i-15 | 1 |
| i-2 | i-1 | i-14 | |
| i-3 | i-2 | i-13 | 1 |
| i-4 | i-3 | i-12 | |
| i-5 | i-4 | i-11 | |
| i-6 | i-5 | i-10 | 3 |
| i-7 | i-6 | i-9 | 2 |
| i-8 | i-7 | i-8 | |
| i-9 | i-8 | i-7 | |
| i-10 | i-9 | i-6 | |
| i-11 | i-10 | i-5 | 1 |
| i-12 | i-11 | i-4 | 2 |
| i-13 | i-12 | i-3 | 4 |
| i-14 | i-13 | i-2 | 5 |
| i-15 | i-14 | i-1 | 6 |
| i-16 | i-15 | i | 2 |

The syndrome taps used for designated data bits in Table I are connected to inputs of the six syndrome detectors, one for each data bit, shown in FIG. 4. The detectors provide bit correction signals X1 through X6 for correcting the six data bits 1 through 6 in exclusive "or" gates 31 through 36. The correction bits X1 and X2 are also applied over paths 54 back to stages of the syndrome storage register SSR following the corresponding taps, but not tap i-16 for which there is no following stage, for the purpose of preventing the propagation of corrected parity-error bits in syndrome register SSR. That is, signal X1 for bit 1 is applied to syndrome stages following taps i-15, i-13 and i-5. Signal X2 for Bit 2 is applied to syndrome stages following taps i-9, i-4 and i.

In the system described in the copending patent application by Maxemchuk, supra, all of the correction bits X1 through X6 are applied over paths 54 back to predetermined stages of the syndrome storage register SSR, as shown in Table II.

TABLE II

| Bit Correction Signals | Applied to Syndrome Stage Following Taps |
|---|---|
| X1 | i-15, i-13, i-5 |
| X2 | i-9, i-4, i |
| X3 | i-10 |
| X4 | i-3 |
| X5 | i-2 |
| X6 | i-1 |

When all of the corrections bits are connected as shown in Table II, the measured error rates, in a channel having a $10^{-3}$ error rate, were greater than the mathematically predicted error rates, as shown in Table III.

TABLE III

| Bit | Predicted Error Rate X1-X6 | Measured Error Rate X1-X6 | Measured Error Rate X1,X2 |
|---|---|---|---|
| 1 | $5.5 \times 10^{-6}$ | $3.5 \times 10^{-5}$ | $8.2 \times 10^{-6}$ |
| 2 | $1.4 \times 10^{-5}$ | $1.6 \times 10^{-5}$ | $1.0 \times 10^{-5}$ |
| 3 | $1.2 \times 10^{-4}$ | $1.2 \times 10^{-4}$ | $1.2 \times 10^{-4}$ |
| 4 | $1.9 \times 10^{-4}$ | $1.4 \times 10^{-4}$ | $1.5 \times 10^{-4}$ |
| 5 | $2.1 \times 10^{-4}$ | $1.2 \times 10^{-4}$ | $1.5 \times 10^{-4}$ |
| 6 | $2.3 \times 10^{-4}$ | $1.5 \times 10^{-4}$ | $1.5 \times 10^{-4}$ |

Table III also shows the measured error rates obtained when solely the bit correction signals X1 and X2 are applied back to the syndrome storage register SSR. Under this condition, the measured error rates for bits 1 and 2 are lower than the measured error rates obtained when all six bit correction signals X1 through X6 are applied back to the syndrome storage register. The improvement in error rate is greatest for bit 1, the improvement being by a factor of 6. The reductions in the error rates are obtained by feeding back bit correction signals for solely the high order bits corresponding with large difference triangles. Large difference triangles have a base of three digits (or may have a base of five digits). Correction signals are not fed back for low order bits corresponding with difference triangles having a one-digit base. The correction signals X3, X4, X5 and X6 are not fed back to the syndrome register because they may falsely represent errors in the respective bits, and their use in complementing bits in the syndrome storage register tends to decrease the ability of the system to correct errors in the high order bits which are more highly protected.

In the described system, double errors in bit paths 1 and 2 can be corrected, but double errors in the bit paths 3, 4, 5 and 6 cannot be corrected. Further, if feedback is derived from these bit paths it can have a deleterious effect on the "stronger" correction paths for bits 1 and 2, since double errors here can lead to anomalous correction of syndromes which are used for correcting the higher order bits. The removal of feedback connections derived from the lower order bit paths, can therefore improve system performance by limiting error propagation, as the experimental results indicate.

The removal of this portion of the feedback from the system has little effect on the correction capabiltiy of the lower order bit paths themselves, since they are only single error correcting to begin with and use fewer "corrected" bits in their syndrome calculations than the higher order paths. The feedback configuration thus has a greater effect upon the correction of the higher order bits, as has been demonstrated. This allows the tradeoff of correction-feedback vs. error propagation to be performed essentially on the basis of its impact upon the higher order (and thus more important) bits only.

In the overall operation of the error detecting and correcting system illustrating one embodiment of the invention, six-bit data words are applied to the inputs in FIG. 1 of encoder shift registers ESR1 through ESR2, and are sent directly out over a communications system to a receiving station. The successive data words propagate through the registers ESR, and signals present at designated taps are applied through the linear modulo 2 adder 20 to produce a parity bit P for transmission. The parity bit P transmitted with a given data word is the result of calculations made on the sixteen next preceding data words.

The transmitted code word is received by a decoder in FIG. 2 having decoder shift registers DSR1 through DSR6 coupled to error-correcting output gates 31 through 36. While the data bits propagate through the decoder shift registers, the linear modulo 2 adder 40 computes parity bits for the received data words for comparison with received parity bits generated by the linear modulo 2 adder 20 at the remote encoder. The locally-generated and received parity bits are compared in gate 42, which produces a parity-error signal when they are different. The parity-error bits are propagated through the syndrome storage shift register SSR, and signals from stages thereof are applied to syndrome majority logic threshold detectors 50 for the generation of error-correcting signals X1 through X6. The error-correcting signals are applied to gates 31 through 36 for correcting the data bits 1 through 6 applied therethrough to a utilization device (not shown). At the same time, the error-correcting signals X1 and X2 are applied to appropriate stages of the syndrome storage shift register to correct parity-error signals propagating therethrough.

What is claimed is:

1. An error detection and correction system for transmitting data words together with parity bits in a manner providing relatively greater protection for at least the highest order bit of the data words; comprising an encoder receptive to the bits of each data word for generating a parity bit according to a self-orthogonal convolutional code constructed by the use of a difference triangle for each of the bits of the data words, the difference triangles being disjoint, at least the triangle associated with the highest order bit having a larger number of base elements than triangles associated with low order bits, said encoder including:

an encoder shift register for each bit of the data word, each shift register having outputs from the first stage and from stages displaced from the first stage by the amounts of the values of the base elements of the triangle associated with the respective data bit, and a first parity generating logic which computes the linear modulo 2 sum of said outputs of said encoder shift registers and provides a parity bit output for each data word; and a decoder receptive over a transmission path to code words, each including a data word and an associated parity bit, from said encoder for detecting and correcting errors in the data words, said decoder including:

a decoder shift register for each bit of a received data word, each shift register having outputs from a first stage and from intermediate stages displaced from the input stage by amounts equal to the values of the base elements of the triangles associated with the respective data bits, and from a terminal stage, a second parity generating logic which computes the linear modulo 2 sum of the outputs from the first and intermediate stages of said decoder shift registers, a syndrome storage shift register, means to compute the modulo 2 sum of each received parity bit with the output of said second parity generating logic and apply the resulting syndrome to the input of said syndrome storage shift register, a syndrome majority logic threshold detector for each bit of the data word, said detectors having inputs from selected stages of said syndrome storage shift register, an error correcting gate for each bit of the data word, each gate being receptive to the output of the terminal stage of a respective decoder shift register and the output of a respective syndrome majority logic threshold detector, and having an output providing a respective error-corrected bit of the data word, and means coupling outputs of syndrome majority logic threshold detectors resulting from the detection of errors in solely the high order bits having difference triangles of large size, relative to the difference triangles of the low order bits, to predetermined points in said syndrome storage register to complement syndrome bits therein.

* * * * *